United States Patent
Drost et al.

(10) Patent No.: US 6,329,836 B1
(45) Date of Patent: Dec. 11, 2001

(54) RESISTIVE ARRAYED HIGH SPEED OUTPUT DRIVER WITH PRE-DISTORTION

(75) Inventors: Robert J. Drost, Mountain View; Robert J. Bosnyak, San Jose, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/580,312

(22) Filed: May 26, 2000

(51) Int. Cl.[7] .......................... H03K 17/16; H03K 19/094
(52) U.S. Cl. .................................. 326/30; 326/83
(58) Field of Search .................. 326/30, 83, 85, 326/86, 87

(56) References Cited

U.S. PATENT DOCUMENTS

| | | | |
|---|---|---|---|
| 4,719,369 | * | 1/1988 | Asano et al. ............. 326/30 |
| 5,604,450 | * | 2/1997 | Borkar et al. ............ 326/82 |
| 6,087,847 | * | 7/2000 | Mooney et al. .......... 326/30 |
| 6,204,683 | * | 3/2001 | Falconer ................. 326/30 |

FOREIGN PATENT DOCUMENTS

402170572A * 7/1990 (JP).

OTHER PUBLICATIONS

"Automatic Impedance Control," DeHon et al., 1993 IEEE International Solid–State Circuits Conference, Feb. 25, 1993.

"A 900 Mb/s Bidirectional Signaling Scheme," Mooney et al., *IEEE Journal of Solid–State Circuits*, vol. 30, No. 12, Dec. 1995.

"A 0.8–$\mu$m CMOS 2.5 GB/s Oversampling Receiver and Transmitter for Serial Links," Yang et al., *IEEE Journal of Solid–State Circuits*, vol. 31, No. 12, Dec. 1996.

* cited by examiner

*Primary Examiner*—Michael Tokar
*Assistant Examiner*—James H Cho
(74) *Attorney, Agent, or Firm*—Townsend and Townsend and Crew LLP (57) ABSTRACT

A high speed self-terminated output driver includes an array of resistive drivers that are pulse-activated in succession to process a corresponding succession of data bits. The output driver thus synthesizes an output waveform which behaves similar to a single resistive drive element responding to the non-bandlimited input signal. In various embodiment, the output driver provides for digitally programmable output impedance and pre-distortion levels.

31 Claims, 9 Drawing Sheets

RESISTIVE ARRAYED HIGH SPEED OUTPUT DRIVER WITH PRE-DISTORTION

BACKGROUND OF THE INVENTION

The present invention relates in general to integrated circuits, and in particular to method and circuitry for implementing high speed output drivers that incorporate resistive series termination and pre-distortion functions.

In order to enable high speed communication, a transmitter with a high speed output driver is needed. For communication over distances appreciable with respect to the signal bit period, termination is also needed to prevent unwanted reflections that would corrupt the signal. Transmission line termination can be implemented outside of the transmitter integrated circuit. This, however, increases the external components count and the cost of the product. It is, therefore, preferred to provide a self-terminating resistive output driver that incorporates the termination. It is also desirable to eliminate or minimize inter-symbol interference (ISI) which results from a frequency bandlimited system. Pre-distortion is a useful technique which allows the transmitter to use its output driver to cancel ISI. Further, in order to keep the output driver inexpensive, it is also desirable to be able to implement the driver in conventional digital CMOS technology.

Accordingly, there is a need for a high-speed output driver circuit that operates at the highest speed possible in a digital CMOS technology, incorporates within its circuit resistive termination and pre-distortion to cancel ISI.

SUMMARY OF THE INVENTION

The present invention offers method and circuitry for implementing high speed output drivers that are self-terminating and incorporate pre-distortion to cancel ISI. Broadly, in one embodiment, an output driver according to the present invention includes multiple resistive drive elements that are pulse-activated in succession to synthesize an output waveform which behaves similar to a single resistive drive element responding to the a non-bandlimited input signal. Due to bandwidth limitation of the pre-drive circuit, it is not possible to generate a single pre-drive signal without introducing significant ISI into the pre-drive signal. By arraying and activating the resistive driver and pre-driver circuits according to the present invention, each individual pre-driver can be equilibrated before each pulse, and any bandwidth limiting of the pulse is seen similarly for each bit period so that ISI does not result.

In a specific embodiment, field effect transistors operating in triode region implement the resistive drive elements. In one embodiment, the final output driver impedance is controlled by modifying the high voltage generated by the pre-driver that pulse activates an output driver leg. In an alternate embodiment, the pre-driver always generates pulses which have the digital power supply voltage, but instead different numbers of output driver legs are pulse activated for a given bit period. The parallel combined resistance is then controlled by digitally selecting different numbers of output drivers to pulse activate for a given bit period. The present invention accomplishes pre-distortion while still maintaining a constant termination output driver impedance by keeping the total number of output driver legs that are turned on for a given bit period constant, while instead selecting some number of legs to connect to the rail corresponding to the opposite bit value.

Accordingly, in one embodiment, the present invention provides an output driver circuit connected to drive an output terminal, including a plurality of resistive elements selectively activated to drive the output terminal; and a timing circuit coupled to the plurality of resistive element, and configured to generate a sequence of activation signals to activate the plurality of resistive elements, wherein, in response to the sequence of activation signals, the plurality of resistive elements are activated in succession to drive a respective plurality of consecutively occurring data bits onto the output terminal.

In another embodiment, the present invention provides a method of driving an output terminal comprising selectively coupling N resistive elements to the output terminal, where N is a positive integer; and sequentially activating the N resistive elements to drive a corresponding sequence of N data bits onto the output terminal.

In yet another embodiment, the present invention provides an output driver circuit for driving an output terminal, comprising: N pull-up transistors coupled between the output terminal and a logic high power supply, the N pull-up transistor operating in linear region when turned on; N pull-down transistors coupled between the output terminal and a logic low power supply, the N pull-down transistors operating in linear region when turned on; N pull-up pre-drivers respectively coupled to the N pull-transistors, and coupled to receive timing control signals and data bits carrying logic high information; and N pull-down pre-drivers respectively coupled to the N pull-down transistors, and coupled to receive timing control signals and data bits carrying logic low information, wherein, N is a positive integer, and wherein, in response to activation signals generated by respective pre-drivers, each one of the N pull-up or pull-down transistors is turned on in succession to drive N consecutive data bits onto the output terminal, respectively.

A better understanding of the nature and advantages of the high speed output driver of the present invention may be gained with reference to the following description and the accompanying drawings.

DESCRIPTION OF THE SPECIFIC EMBODIMENTS

Figure 1A:
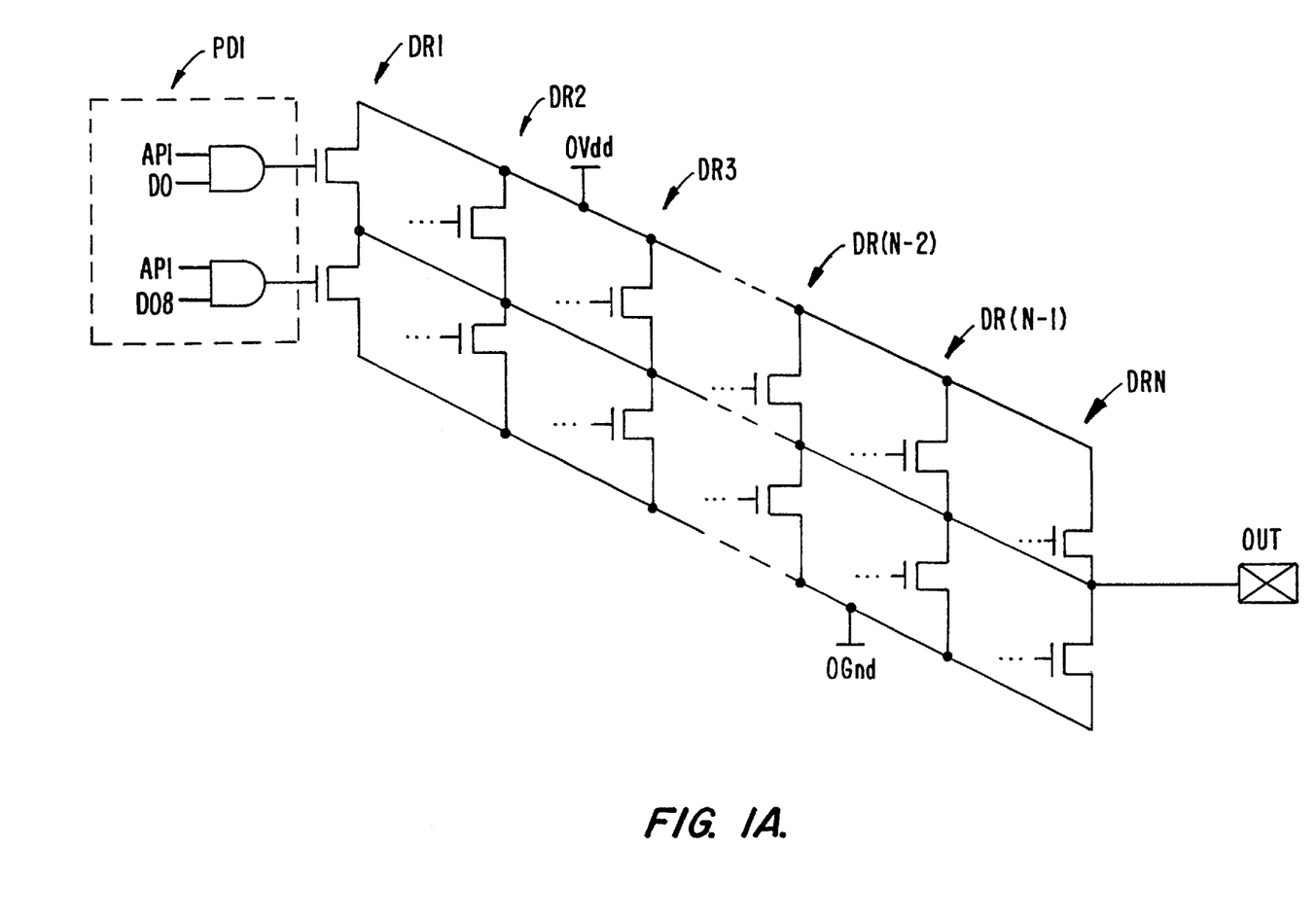
FIG. 1A is a simplified schematic for an exemplary put driver circuit with an array of resistive drivers according to the present invention.

The resistive arrayed output driver of the present invention provides essentially separate individual drivers for multiple consecutive output data bits. In one embodiment, each resistive driver is independently controlled by a dedicated pre-driver that operates in response to the output data and an activation signal. Referring to FIG. 1A, there is shown a highly simplified schematic for an output driver circuit with an array of N resistive drivers according to the present invention. The output driver includes N driver legs DR1 to DRN all connecting to the output node OUT. Each driver leg DR(i) includes a pull-up resistive element and a pull-down element. In a preferred embodiment, the resistive elements are implemented using an MOS transistor that operates in the triode (linear) region. Each driver stage is driven by a pre-driver PD(i) that logically combines the corresponding data output bit DO (or its complement DOB for the pull-down transistor) and its activation pulse AP(i) to generate the drive signal for the transistors in the driver leg. The activation signals for the multiple pre-drivers are sequentially generated by a clock circuit. Accordingly, the series of activation pulses are gated by a corresponding series of output data bits. In this fashion, N consecutive bits of output data are separately driven onto the output node by N resistive drivers.

Figure 1B:
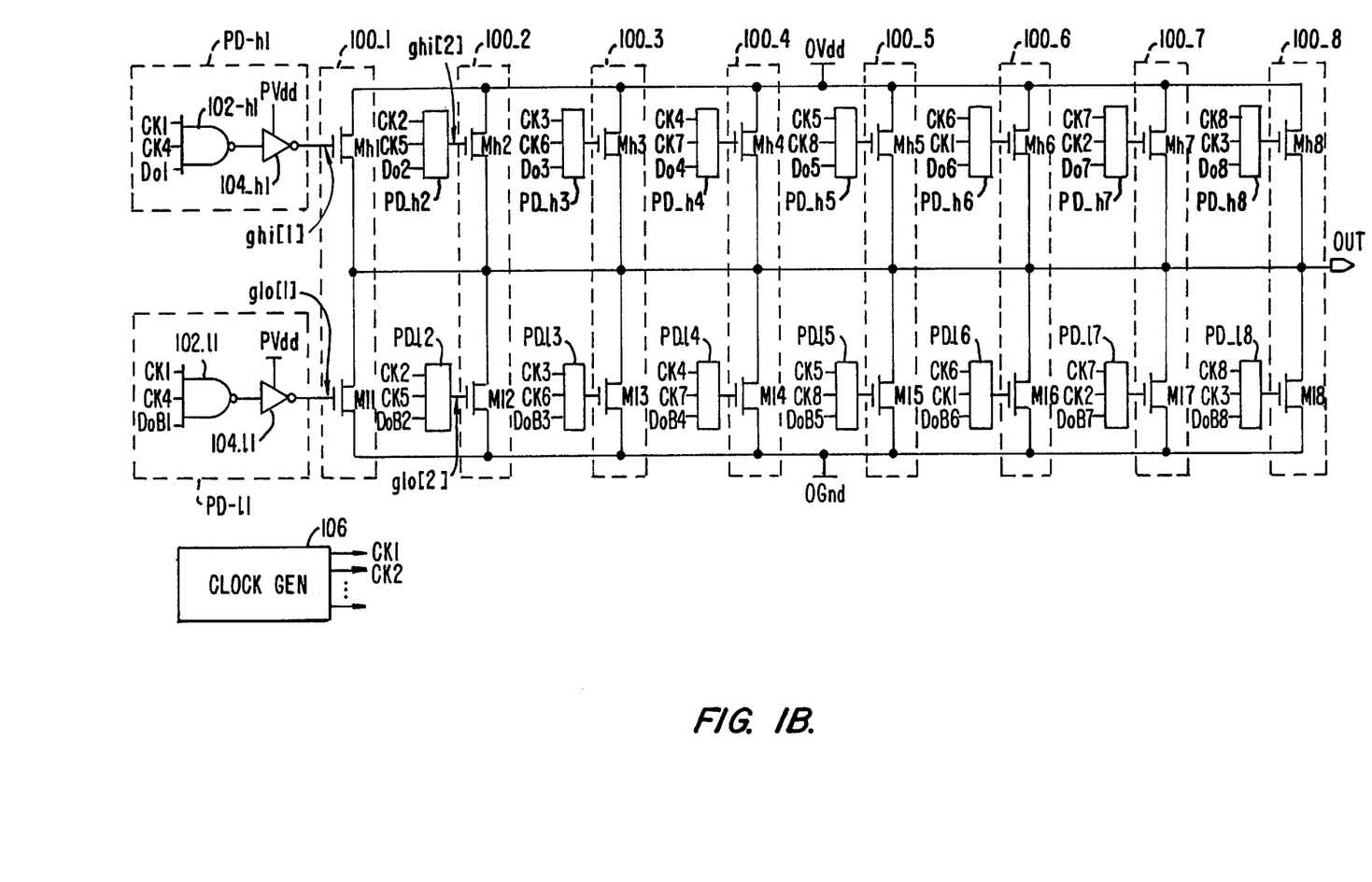
FIG. 1B is an exemplary circuit implementation for the resistive-arrayed output driver of the present invention.

FIG. 1B shows a specific example of the output driver of the invention wherein the array of resistive drivers includes eight parallel-connected individual driver legs 100-1 through 100-8. Each driver leg 100-a is made up of a pull-up transistor Ml(i) that connects between the output power supply voltage OVdd and output node OUT, and a pull-down transistor Mli that connects between output node OUT and output ground OGnd. Each pre-driver PD-h/l(i) receives the data signal DO (or its inverse DOB) that is to be driven onto the output OUT, as well as an activation pulse. An exemplary embodiment for a pre-driver is shown for PD-h1 and PD-11 wherein each includes a three-input NAND gate 102 that receives two clock signals and the output data signal, followed by an inverter 104. A clock generator 106 generates the various clock signals CK1 to CK8 for the pre-drivers. In this embodiment, inverter 102 runs off of a power supply voltage PVdd that may be different from output power supply voltage OVdd.

Figure 2:
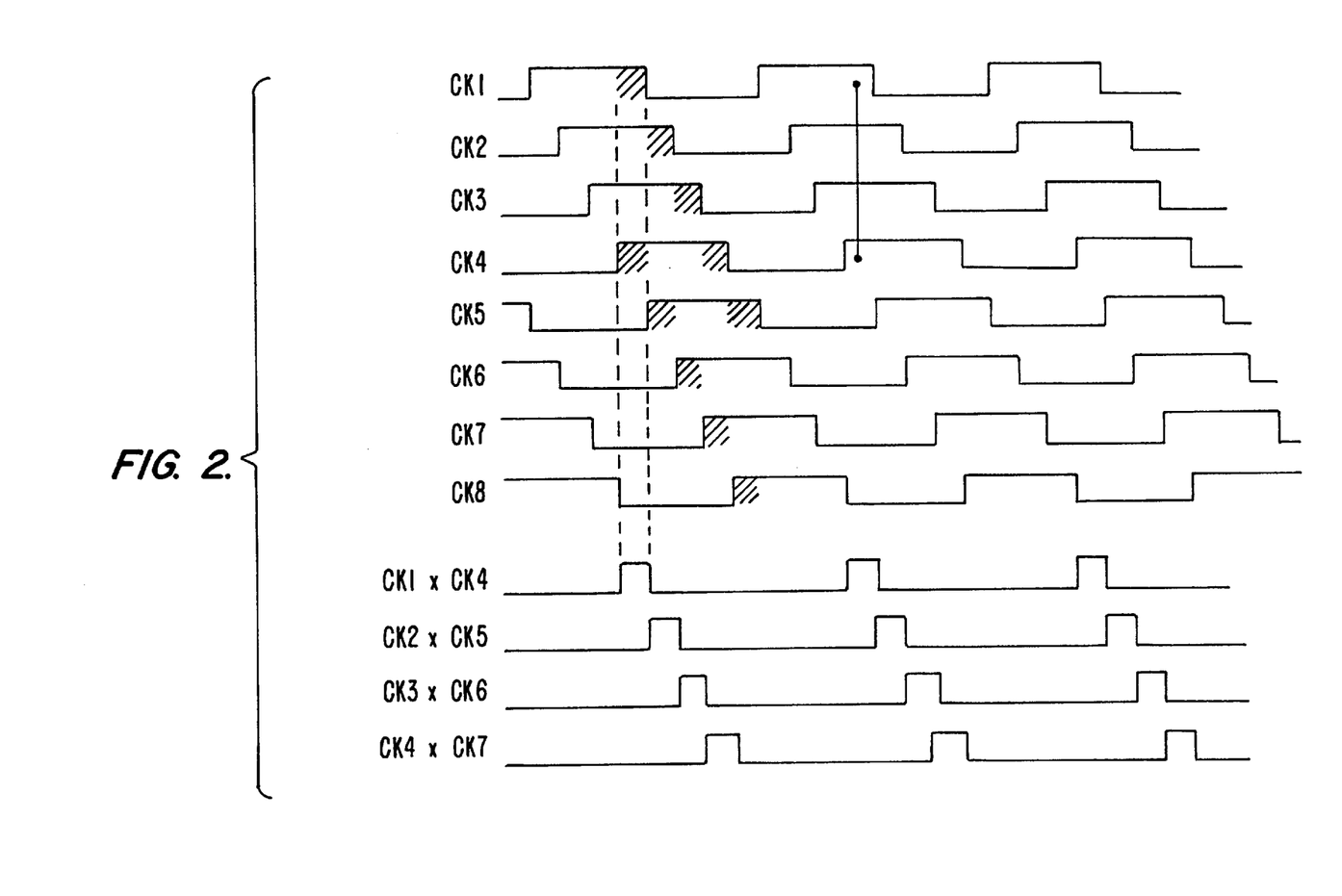
FIG. 2 is a timing diagram illustrating one example of how activation signals can be generated for the array of resistive output drivers of the embodiment of FIG. 1.

In operation, the clock signals are timed such that consecutive activation pulses are generated by pre-drivers PD. To generate the clock signals for the eight-leg embodiment shown in FIG. 1, clock generator 106 divides one clock period into eight equal phases, wherein during each phase an activation pulse is generated for a corresponding pre-driver. One way to generate the activation signals is to delay the primary clock signal Ck1 by one phase delay to generate Ck2, two phase delays to generate Ck3, and so on as shown in FIG. 2. By performing a logical AND operation between Ck1 and Ck4, a ⅛ activation pulse is generated. Consecutive activation pulses are similarly generated by ANDing Ck2 and Ck5, Ck3 and Ck6, and so on. Each activation pulse is also ANDed with the data signal DO and DOB to provide the drive signals gli(i) and ghi(i) for the pull-down and pull-up transistors (Mli and Mhi). Thus, the first bit of output data DO(t2) is driven by driver 100-1 (Mh1 if DO(t1)=high, or Ml1 if DOB(t1)=high), the following bit DO(t2) is driven by driver 100-2 (Mh2 if DO(t2)=high, or Ml2 if DOB(t2)= high), and so on until the eighth bit which is driven by driver 100-8 (Mh8 and Ml8), after which driver 100-1 is pulse activated again for another cycle of eight bits. A cycle of eight bits (or a frame) of data is thus driven consecutively by the eight driver legs. In this embodiment n-channel transistors operating in their linear region are used for Mh(i) and Ml(i). In order to keep the output driver transistors Mh(i) and Ml(i) fairly linear, in a specific embodiment, these transistors operate at a lower output voltage swing as compared to the digital power supply voltage for the rest of the circuit. The output supply voltage OVdd can be, for example, about 1.0 volt for a circuit operating with a 3.3 volt digital supply voltage.

Figure 3:
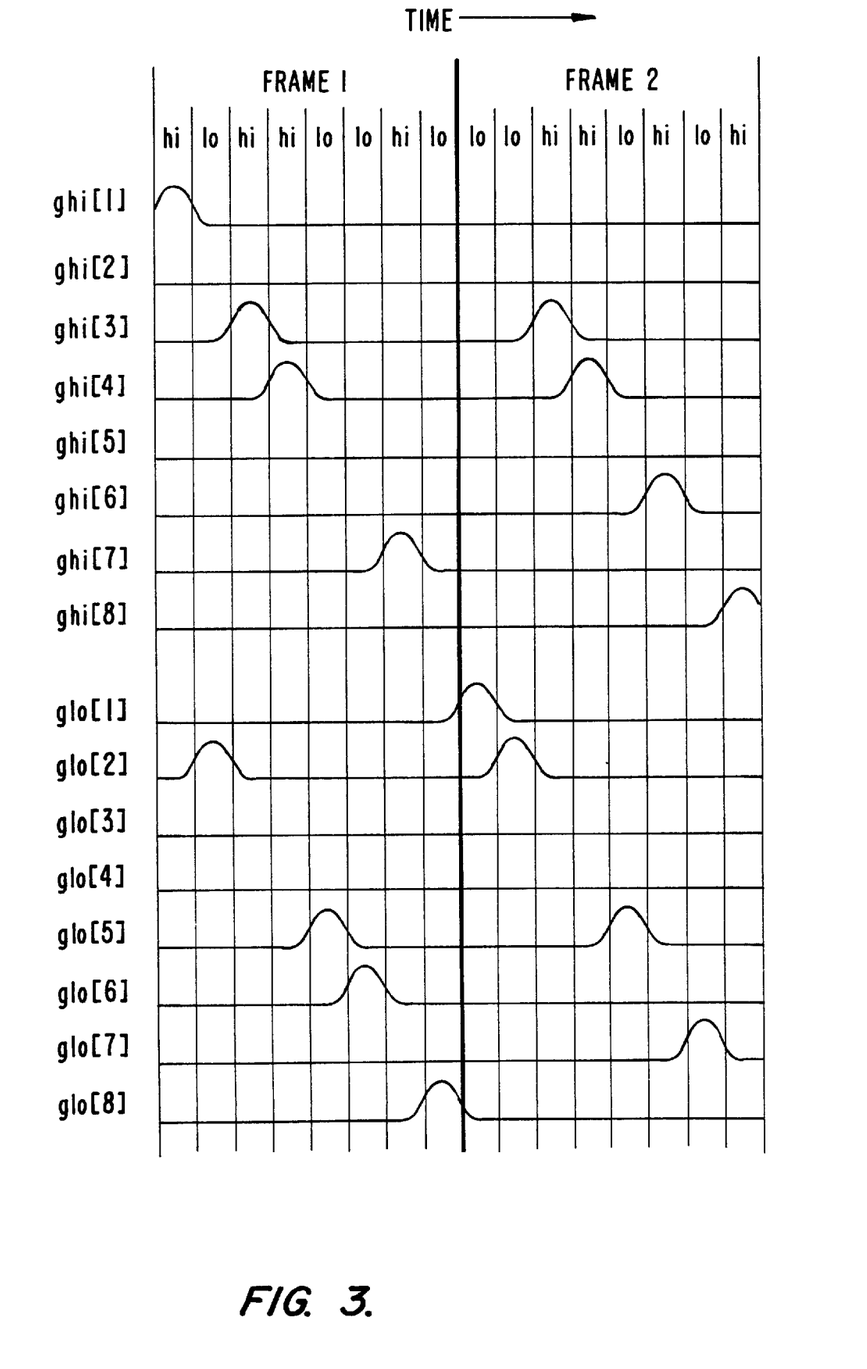
FIG. 3 is a timing diagram illustrating an exemplary sequence of activation for the array of resistive dividers shown in the embodiment of the FIG. 1.

FIG. 3 shows a timing diagram for drive signals gli(i) and ghi(i) during two 8-bit frames of arbitrary data. Referring to FIGS. 3 and 1A, a logic high for the first bit in the first frame results in a pulse at ghi(1) to turn on the pull-up up transistor Mh1 in driver 100-1, while glo(1) remains low to keep pull-down transistor Ml1 in driver 100-1 off. This causes OUT to be pulled up to OVDD. Note that ghi(1) is reset and driver 100-1 is tri-stated for the rest of the first frame (i.e., for the remaining seven bits). The second data bit, a logic low, is driven by the second driver leg 100-2 wherein ghi(2) is low keeping transistor Mh2 off and glo(2) is pulsed high turning transistor Ml2 on to pull OUT down to OGnd. Driver 100-2 is tri-stated during the remaining seven bits of data. As can be seen from the diagram each driver is similarly tri-stated for seven bits out of each 8-bit frame. This allows each individual pre-driver to be equilibrated before each activation pulse such that any bandwidth limiting of the pulse is seen similarly for each bit period. ISI is therefore significantly reduced. It is to be understood that the number of driver legs in the output driver may vary depending on circuit requirements. In general, for an N legged driver, each driver is activated for one bit and is tri-stated for N−1 bit times. Therefore the larger the number N the lower the ISI.

The final output driver impedance is given by the resistance of the activated MOS transistor operating in the linear region. According to the present invention, the value of the output impedance can be controlled in different ways. In one embodiment, the present invention modifies the final output impedance of the driver by adjusting the supply voltage of the pre-drivers. Referring to FIG. 1B, the level of the high supply voltage PVdd applied to the pre-driver inverters (104-h and 104-l) controls the level of driver signals ghi and glo that are applied to the gate terminals of the driver transistors Mh(i) and Ml(i). Driver transistors Mh(i) and Ml(i) can thus be biased in the linear region at a point that exhibits the desired output impedance. In an alternative embodiment, the present invention does not vary the power supply level for the pre-drivers and uses the digital power supply voltage to generate the pulses, but instead modifies the output impedance of the driver by pulse activating different numbers of parallel-connected output transistors for a given bit period. That is, each leg of the output driver (i.e., 100-1 through 100-8) is configured to include several, preferably identical, parallel-connected sub-drivers. The number of parallel-connected sub-drivers that are activated is digitally controlled to provide the desired output impedance. This aspect of the invention will be described in greater detail further below in connection with FIG. 4.

In yet another embodiment, the present invention provides for pre-distortion of the output signal while still maintaining a constant termination output driver impedance. Pre-distortion is accomplished by driving a digitally selected number of sub-drivers using delayed data in parallel with sub-drivers that drive the current data. That is, for example, to achieve one bit pre-distortion, DOB(t−1) is driven by identical sub-driver(s) in parallel with the sub-driver(s) that drive DOB(t). To maintain a constant termination impedance for the output driver, the present invention keeps the total number of sub-drivers that are turned on for a given bit period constant, while selecting some number of sub-drivers (up to half) to connect to the rail corresponding to the opposite bit value. For example, if to achieve the desired output termination impedance eight sub-drivers are to be turned on per bit, then a full high bit will have all eight sub-drivers connected to the output high rail (OVdd), while a 75% high bit will have seven sub-drivers connected to the output high rail and one sub-driver connected to the output low rail (OGnd). Further cases are six high, two low for 50%, five high, three low for 25%, and four high and four low for 0%. Whether the delayed data bits are inverted (as in the above example) or not is optional.

Figure 4:
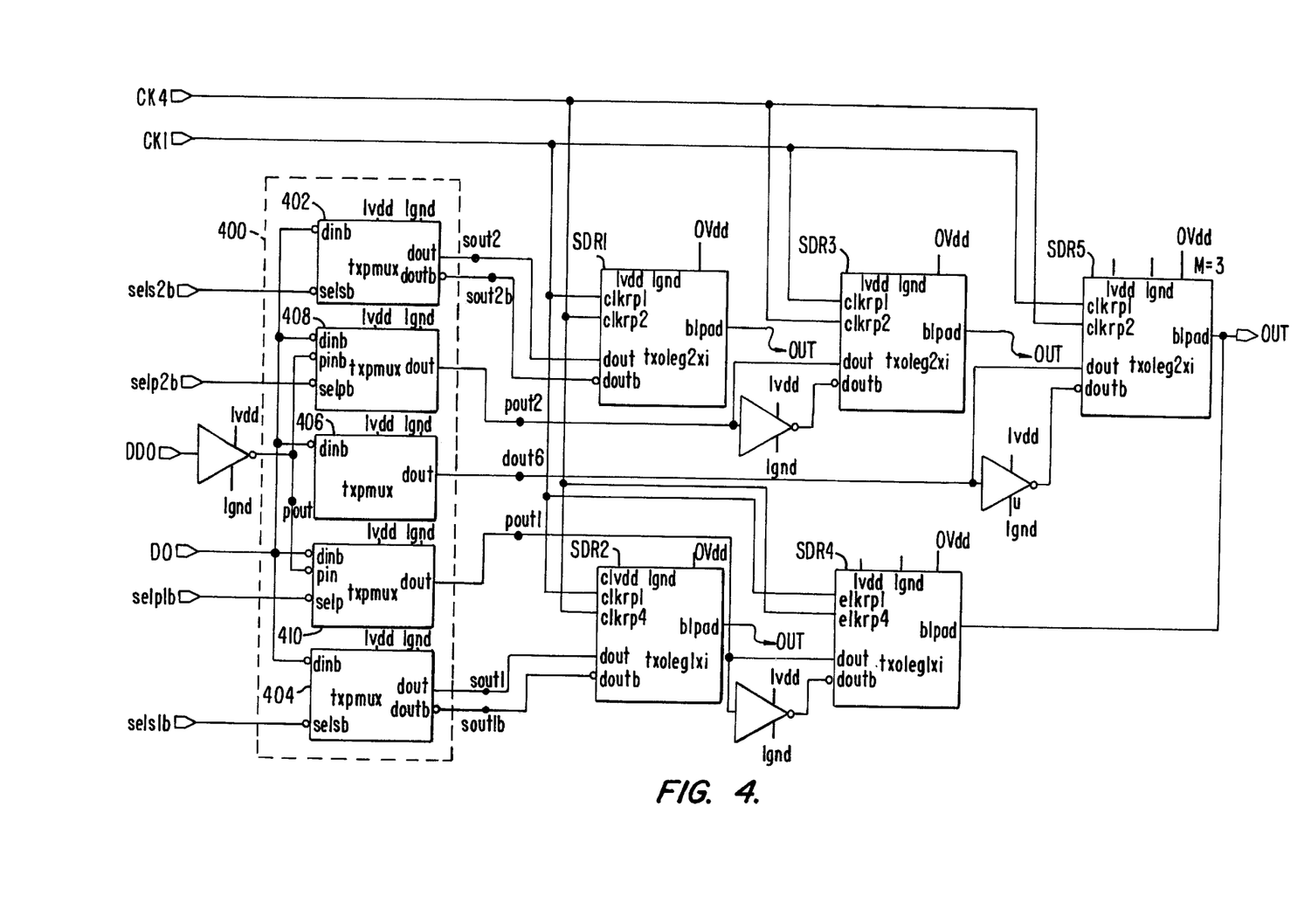
FIG. 4 shows an exemplary circuit implementation for one leg of resistive arrayed high speed output driver of the present invention.
Figure 5:
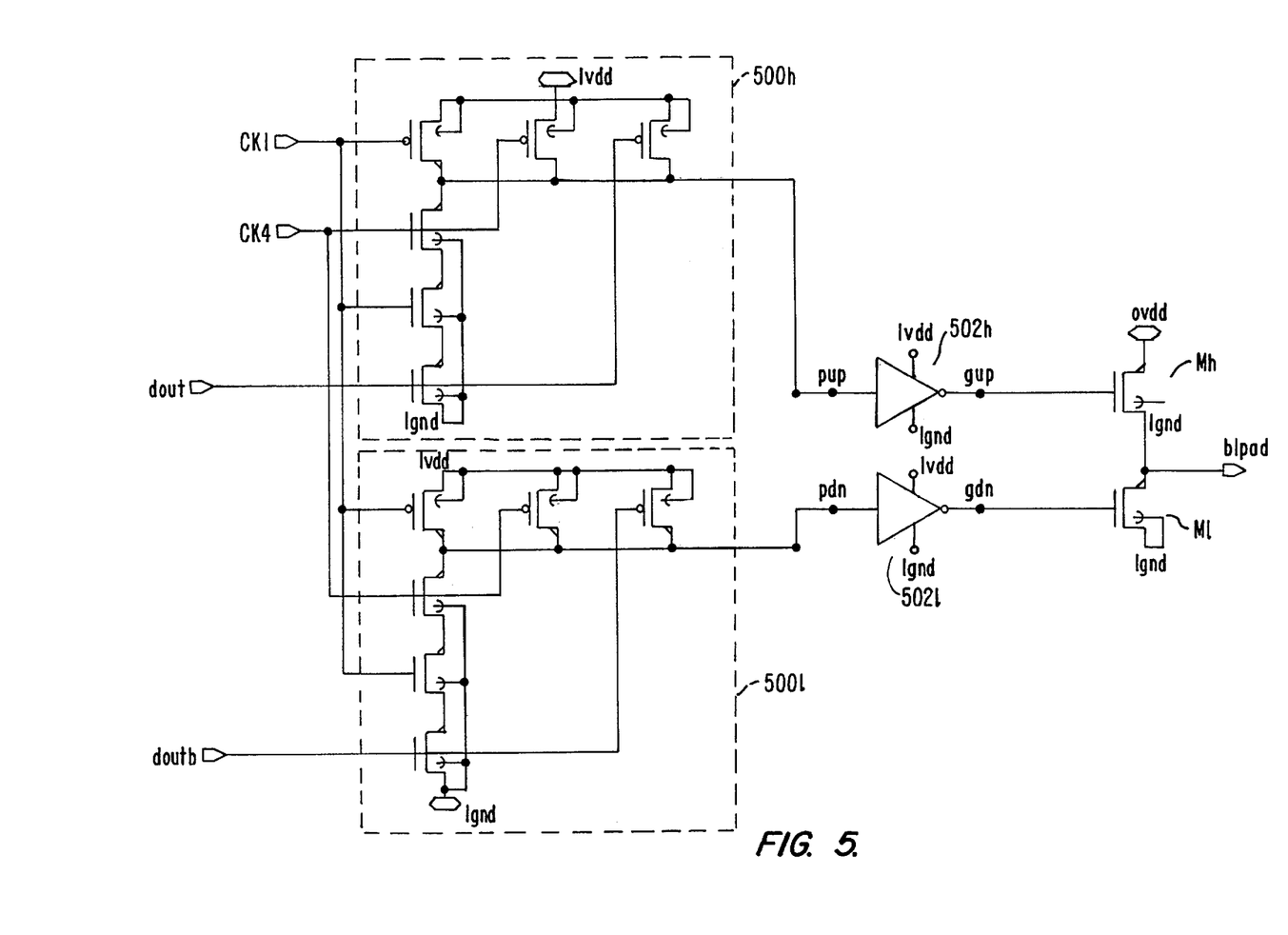
FIG. 5 shows an exemplary circuit implementation for a sub-driver used in the driver of FIG. 4.

To maximize the flexibility of the output driver of the present invention in providing digitally programmable termination impedance as well as pre-distortion, each driver stage is equipped with a digitally controlled combination of multiple sub-drivers that selectively respond to output data or delayed output data, or both. FIG. 4 is one exemplary implementation for a driver stage that provides for digitally programmable driver strength and pre-distortion. For illustrative purposes the driver circuit of FIG. 4 corresponds to the first stage of the output driver of FIG. 1B that receives Ck1 and Ck4. This exemplary driver stage thus processes the first bit of an 8-bit output data frame. The driver includes two sub-drivers SDR1 and SDR2 that either drive DO(t) to control the output impedance and drive strength or are tri-stated, two sub-drivers SDR3 and SDR4 that selectively drive either DO(t) for strength programming or DOBt–1)) for pre-distortion programming, and a final sub-driver SDR5 that drives DO(t). Sub-drivers SDR essentially include the pre-drivers and the MOS output transistors similar to those shown in FIG. 1B, however, they may vary in their drive capability (i.e., strength). In a specific embodiment, sub-drivers SDR1 and SDR3 are made twice as strong as sub-drivers SDR2 and SDR4, and SDR5 six times as strong. The strength of the sub-drivers may be varied by either adjusting the size of the output transistors (e.g., doubling the W/Ls for SDR3 and SDR4), or by connecting in parallel multiple identical sub-drivers, or a combination thereof (e.g., three double SDR's to implement SDR5). An exemplary circuit implementation for the various sub-drivers SDR is shown in FIG. 5. Much like the circuit of FIG. 1B, the sub-driver of FIG. 5 includes two three-input NAND gates 500$h$ and 500$l$ that receive CK1 and CK4 and complementary data signals dout and doutb. Two inverters 502$h$ and 502$l$ respectively receive the outputs of NAND gates 500$h$ and 500$l$ and drive output transistors Mh and Ml.

Figure 6:
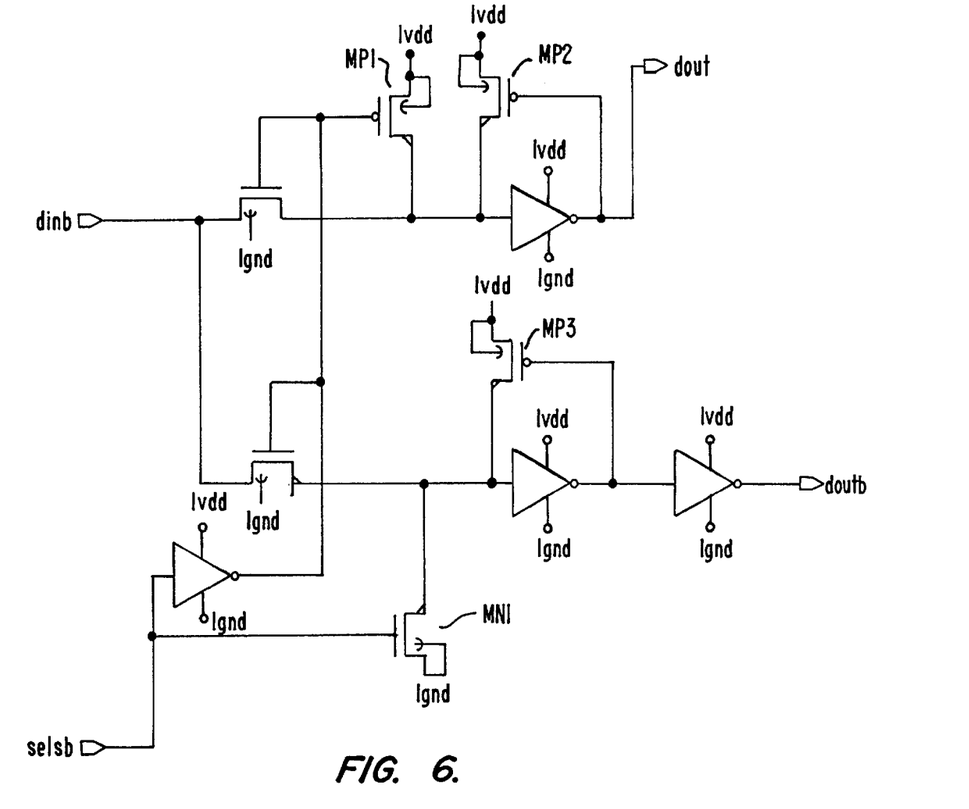
FIGS. 6, 7 and 8 illustrate exemplary circuit implementations for various multiplexers used in the output driver of FIG. 4.

Referring back to FIG. 4, the driver further includes a bank of multiplexers 400 that selectively supplies inputs to the sub-drivers. A transmit strength multiplexer or txsmux 402 receives the output data DO at one input din and a strength select signal sels2$b$ at another input selsb. By applying a logic low at input sels2$b$, txsmux 402 allows output data DO to drive SDR1. A logic high at input sels2$b$ grounds both outputs of txsmux 402 to tri-state SDR1. Another identical multiplexer txsmux 404 receives a select input sels1$b$ to either activate or tri-state SDR2. An exemplary circuit implementation for the txsmux is shown in FIG. 6. Transistors MP1 and MN1 pull both outputs dout and doutb to ground when selsb is high. The remaining circuit elements process the data at dinb. Optional feedback transistors MP2 and MP3 operate to pull inverter input nodes up to the power supply for high going input transition. This saves power by preventing static current and increases speed of the multiplexer.

Figure 7:
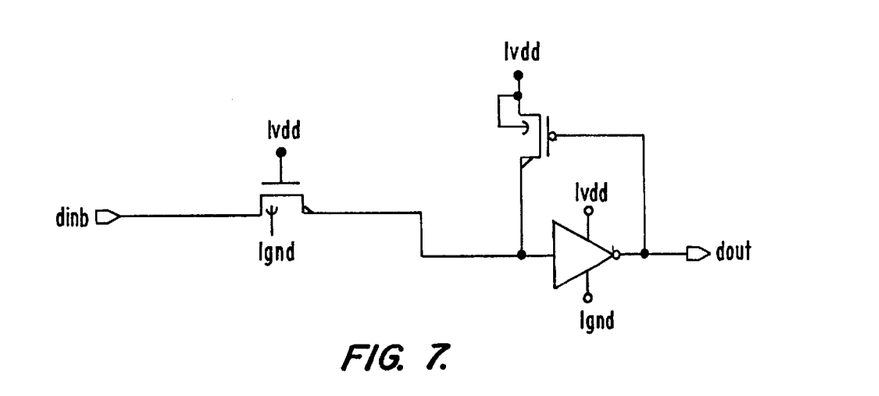
Figure 8:
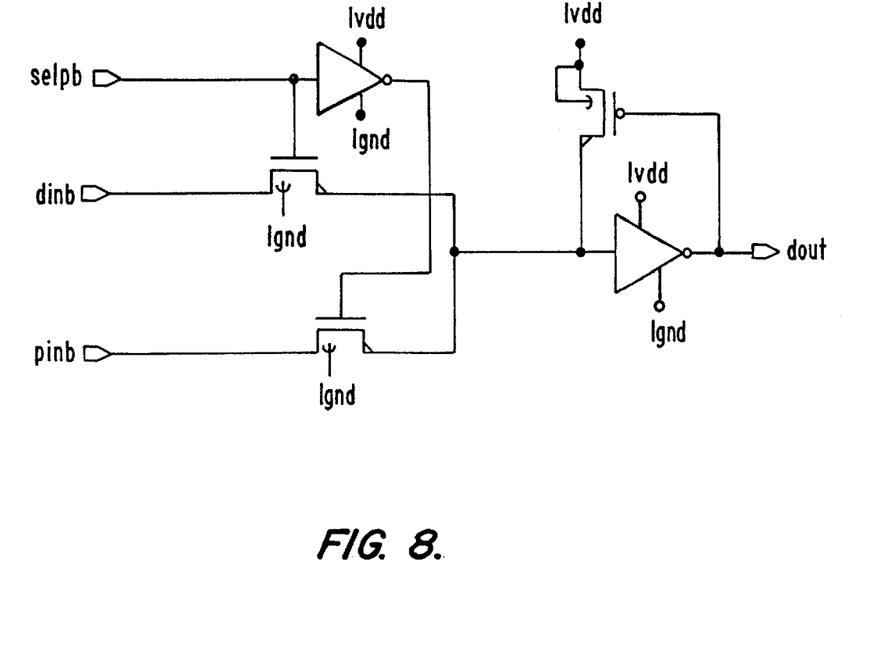

Bank of multiplexers 400 further includes a dummy multiplexer txdmux 406 that applies the output data DO to sub-driver SDR5. Dummy multiplexer 406 does not perform any multiplexing function and is included only to match the delay along the data path that is introduced by the other multiplexers. An exemplary circuit implementation for txdmux 406 is shown in FIG. 7 wherein data applied to dinb mux 406 goes through a pass transistor that is always turned on and an inverter. The pre-distortion sub-drivers SDR3 and SDR4 receive their inputs from transmit pre-distortion multiplexers txpmux 408 and 410 respectively. These multiplexers select between the current output data DO or a delayed output data DDO. Thus, depending on the state of the select input selpb, SDR3 and SDR4 either drive DO or drive DDO. An exemplary circuit implementation for txpmux is shown in FIG. 8.

As thus constructed, the output driver stage of FIG. 4 drives the output node OUT with a fixed factor-of-six sub-driver SDR5. The drive strength can be programmably supplemented by either an additional factor of one when SDR2 is activated (and SDR1 is tri-stated), a factor of two when SDR1 is activated (and SDR2 is tri-stated), or a factor of three when both SDR1 and SDR2 are activated. The strength can be further supplemented by factors of one, two or three in a similar fashion by programming SDR3 and SDR4. SDR3 and SDR4 also provide for programmable adjustable pre-distortion in combination with the programmable strength adjustment. These sub-drivers provide for the combinations of one data and two pre-distortion, two data and one pre-distortion, and three data. It is to be understood that it is possible to construct a driver stage that provides any other combination of drive strength and pre-distortion by varying the number, size and connectivity of the sub-drivers.

Figures 9, 10:
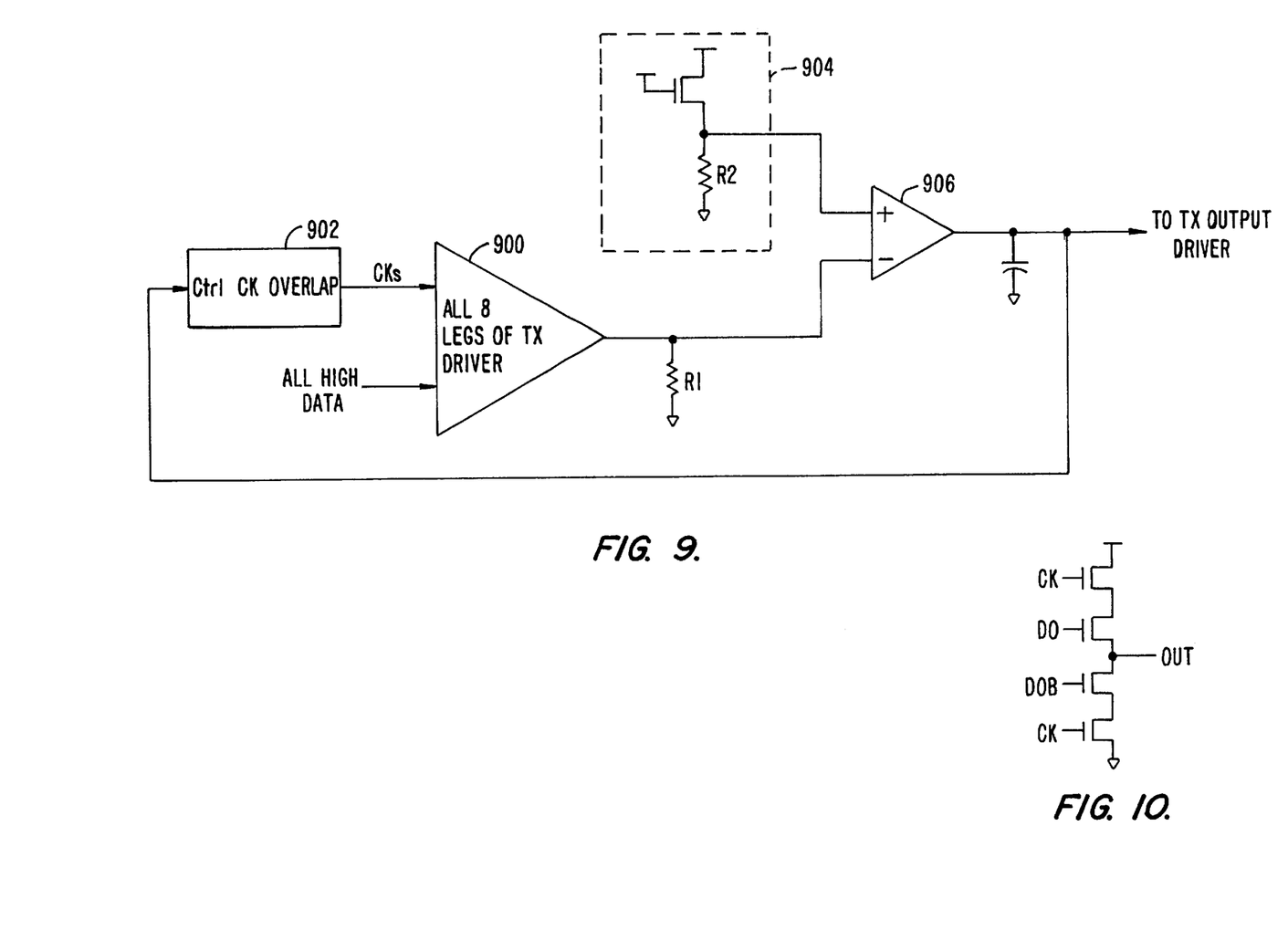
FIG. 9 is a simplified block diagram of a servo loop for automating bit width control according to the present invention.
FIG. 10 shows an alternative embodiment for an output driver using series stacked output transistors.

In one embodiment, the output driver of the present invention controls the width of the pre-driver output pulses ghi(i) and glo(i) to achieve optimum overlap between two consecutive pulses. This ensures that the output driver maintains a constant termination impedance while maximizing the bit period. The output driver ensures just enough overlap to allow consecutive output driver legs to turn off/on presenting an impedance which is constant during transition. Too little overlap would emulate break before make where no output transistor would be fully turned on momentarily presenting a high impedance on the line. Too much overlap would emulate make before break where two output transistors in two driver legs are simultaneously turned on during transition momentarily presenting a 50% reduction in output impedance. In order to optimize the overlap, in a specific embodiment, the output driver of the present invention includes a control loop to control the amount of overlap. FIG. 9 shows a simplified block diagram of the automatic bit width control loop for optimizing the overlap in the pre-driver output pulses. The feedback loop includes a dummy driver 900 that replicates the actual transmit output driver (e.g., replicates all eight legs of the driver of FIG. 1B). Replica driver 900 receives the clock signals from clock generator 902 and an all high (or all low) signal at its data input. Replica driver 900 drives a dummy resistive load R1 connected at its output. The output of replica driver 900 is compared against the output of a single replicated output driver leg 904 by a comparator 906. Dummy output driver leg 904 is held constantly on. An analog signal generated at the output of comparator 906 is fed back to clock generator 902 to control the duty cycle of the clock signals. The control loop thus adjusts the duty cycle of the clock signals until replicated output driver 900 and replicated output driver leg 904 produce the same average voltage. This condition gives optimal overlap of the output bits.

The present invention thus provides various embodiments for methods and circuitry to implement a high speed output driver with significantly reduced ISI. The output driver also provides for digitally programmable drive strength and pre-distortion. While the above provides a complete description of specific embodiments of the present invention, it is possible to use various alternatives, modifications and equivalents. For example, in an alternative embodiment, the output driver of the present invention uses series gating of two transistors per output drive leg as shown in FIG. 10. According to this embodiment, clock signals are directly applied to series MOS transistors inserted in the output leg as shown. Thus, clock signals pulsed high for the duration of the bit period enable each driver leg eliminating pre-drivers. Other variations such as greater than 1-bit pre-distortion can be implemented by the output driver of the present invention. Therefore, the scope of the present invention should be determined not with reference to the above description alone but should, instead, be determined with reference to the appended claims along with their full scope of equivalents.

What is claimed is:

1. An output driver circuit connected to drive an output terminal, comprising:
   a plurality of resistive elements selectively activated to drive the output terminal; and
   a timing circuit coupled to the plurality of resistive elements, and configured to generate a sequence of activation signals to activate the plurality of resistive elements,
   wherein, in response to the sequence of activation signals, the plurality of resistive elements are activated in succession to drive a respective plurality of consecutively occurring data bits onto the output terminal.

2. The output driver circuit of claim 1 wherein the plurality of resistive elements comprises a plurality of driver legs with each leg having a pull-up resistive element coupled between the output terminal and a logic high power supply, and a pull-down resistive element coupled between the output terminal and a logic low power supply.

3. The output driver circuit of claim 2 wherein each of the pull-up resistive clement and the pull-down resistive element comprises a field effect transistor that when turned on operates in linear region.

4. The output driver circuit of claim 3 wherein the timing circuit comprises a plurality of pre-drivers coupled to the plurality of driver legs, respectively, each pre-driver being configured to receive a clock signal and a data bit and to generate an activation signal.

5. The output driver circuit of claim 4 wherein each pre-driver comprises:
   a first logic circuit coupled to a respective pull-up resistive element and configured to logically combine a data bit representing a logic high with an associated clock signal; and
   a second logic circuit coupled to a respective pull-down resistive element and configured to logically combine a data bit representing a logic low with an associated clock signal.

6. The output driver circuit of claim 5 wherein the first logic circuit and the second logic circuit each comprise circuitry to perform AND logic.

7. The output driver circuit of claim 3 wherein the field effect transistor is of n-channel type.

8. The output driver circuit of claim 7 wherein a power supply voltage for the plurality of resistive elements is smaller than a power supply voltage for other parts of circuitry coupled to the output driver circuit.

9. The output driver circuit of claim 3 wherein an output termination impedance of the driver circuit is varied by varying on-resistance of selected field effect transistors.

10. The output driver circuit of claim 9 wherein the on-resistance of selected field effect transistors is varied by modifying a level of the logic high power supply voltage to the field effect transistors.

11. The output driver circuit of claim 9 wherein the on-resistance of selected field effect transistors is varied by programmably coupling one or more field effect transistors in parallel to the selected field effect transistors.

12. The output driver circuit of claim 3 wherein each drive leg further comprises a clocked pull-up transistor stacked between the pull-up transistor and the logic high power supply, and a clocked pull-down transistor stacked between the pull-down transistor and the logic low power supply.

13. The output driver circuit of claim 2 wherein a driver leg further comprises a programmable pull-up resistive element coupled in parallel to the pull-up resistive element, and a programmable pull-down resistive element coupled in parallel to the pull-down resistive element.

14. The output driver circuit of claim 13 wherein when selected the programmable pull-up and pull-down resistive elements respond to the same data bits as that applied to the pull-up and pull-down resistive elements.

15. The output driver circuit of claim 13 wherein when selected the programmable pull-up and pull-down resistive elements respond to data bits that are delayed in time with respect to the data bit applied to the pull-up and pull-down resistive elements.

16. The output driver circuit of claim 2 wherein a driver leg further comprises:
   a first programmable pull-up resistive element coupled in parallel to the pull-resistive element such that when selected it provides additional drive for data bit driven by the pull-up resistive element;
   a first programmable pull-down resistive element coupled in parallel to the pull-down resistive element such that when selected it provides additional drive for data bit driven by the pull-down resistive element;
   a second programmable pull-up resistive element coupled in parallel to the pull-up resistive element such that when selected it drives a delayed data bit in parallel with the pull-up resistive element to provide for pre-distortion; and
   a second programmable pull-down resistive element coupled in parallel to the pull-down resistive element such that when selected it drives a delayed data bit in parallel with the pull-down resistive element to provide for pre-distortion.

17. The output driver circuit of claim 16 further comprising digitally-controlled select circuitry coupled to the programmable resistive elements for selectively applying a respective data bit or a delayed data bit to the respective programmable resistive element.

18. The output driver circuit of claim 16 wherein any one of the first and second programmable pull-down and pull-down resistive elements can be configured to process either a current data bit to vary output termination impedance, or a delayed data bit to provide for pre-distortion.

19. The output driver circuit of claim 1 further comprising control circuitry coupled to the timing circuit and configured to optimize an overlap between successive activation signals.

20. The output driver circuit of claim 19 wherein the control circuitry comprises a servo loop that compares an output of a replicated output driver circuit against an output of a replicated single resistive element and controls the timing circuit to generate consecutive activation signals with optimal overlap.

21. A method of driving an output terminal comprising:

selectively coupling N resistive elements to the output terminal, where N is a positive integer; and sequentially activating the N resistive elements to drive a corresponding sequence of N data bits onto the output terminal.

22. The method of claim 21 wherein each one of the N resistive elements is activated for one data bit period and de-coupled from the output terminal for N−1 data bit periods.

23. The method of claim 22 further comprising pre-distorting an output signal on the output terminal by programmably driving a delayed data bit in parallel with an activated resistive element.

24. The method of claim 23 further comprising varying an output termination impedance at the output terminal by programmably driving a data bit in parallel with an activated resistive element.

25. The method of claim 22 further comprising varying an output termination impedance at the output terminal by programmably driving a data bit in parallel with an activated resistive element.

26. The method of claim 21 further comprising automatically optimizing an amount of overlap between activation signals that sequentially activate the N resistive elements.

27. An output driver circuit for driving an output terminal, comprising:

N pull-up transistors coupled between the output terminal and a logic high power supply, the N pull-up transistor operating in linear region when turned on;

N pull-down transistors coupled between the output terminal and a logic low power supply, the N pull-down transistors operating in linear region when turned on;

N pull-up pre-drivers respectively coupled to the N pull-transistors, and coupled to receive timing control signals and data bits carrying logic high information; and N pull-down pre-drivers respectively coupled to the N pull-down transistors, and coupled to receive timing control signals and data bits carrying logic low information, wherein, N is a positive integer, and wherein, in response to activation signals generated by respective pre-drivers, each one of the N pull-up or pull-down transistors is turned on in succession to drive N consecutive data bits onto the output terminal, respectively.

28. The output driver circuit of claim 27 wherein a pair of pull-up and pull-down transistors is responsive to one data bit and is tri-stated for N−1 data bits.

29. The output driver circuit of claim 27 further comprising programmable pull-up and pull-down transistors respectively coupled to the N pull-up and pull-down transistors, and configured to programmably alter output termination impedance of the output driver circuit.

30. The output driver circuit of claim 27 further comprising programmable pull-up and pull-down transistors respectively coupled to the N pull-up and pull-down transistors, and configured to programmably pre-distort signal on the output terminal.

31. The output driver circuit of claim 27 further comprising a control circuit for adjusting the timing signals to optimize an overlap between successive activation signals.

* * * * *